United States Patent
Bigman

(10) Patent No.: US 10,394,453 B1
(45) Date of Patent: Aug. 27, 2019

(54) METHOD AND SYSTEM FOR CHOOSING AN OPTIMAL COMPRESSION ALGORITHM CONSIDERING RESOURCES

(71) Applicant: EMC IP Holding Company LLC, Hopkinton, MA (US)

(72) Inventor: Ron Bigman, Holon (IL)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 15/267,790

(22) Filed: Sep. 16, 2016

(51) Int. Cl.
*G06F 12/00* (2006.01)
*G06F 13/00* (2006.01)
*G06F 3/06* (2006.01)

(52) U.S. Cl.
CPC ............ *G06F 3/0608* (2013.01); *G06F 3/064* (2013.01); *G06F 3/0661* (2013.01); *G06F 3/0673* (2013.01)

(58) Field of Classification Search
CPC ........... G06F 12/00; G06F 12/08; G06F 13/00
See application file for complete search history.

(56) References Cited

U.S. PATENT DOCUMENTS

| | | | |
|---|---|---|---|
| 2005/0149211 A1* | 7/2005 | Gregori | G05B 19/19 700/58 |
| 2007/0038738 A1* | 2/2007 | Iyengar | G06F 11/3466 709/224 |
| 2007/0096954 A1* | 5/2007 | Boldt | H03M 7/30 341/50 |
| 2011/0082842 A1* | 4/2011 | Groseclose, Jr. | G06F 3/0608 707/693 |
| 2017/0024276 A1* | 1/2017 | Kanno | G06F 11/1008 |

* cited by examiner

*Primary Examiner* — Tuan V Thai
(74) *Attorney, Agent, or Firm* — Ryan, Mason & Lewis, LLP

(57) ABSTRACT

Example embodiments of the present invention relate to methods, systems, and a computer program product for storing data compressed according to available system resources. The method includes evaluating system resources of a data storage system and selecting a compression algorithm according to the system resources. The data set then may be compressed according to the selected compression algorithm and the compressed data stored in the data storage system.

20 Claims, 6 Drawing Sheets

METHOD AND SYSTEM FOR CHOOSING AN OPTIMAL COMPRESSION ALGORITHM CONSIDERING RESOURCES

A portion of the disclosure of this patent document may contain command formats and other computer language listings, all of which are subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

CROSS REFERENCE TO RELATED APPLICATION

This Application is related to U.S. patent application Ser. No. 14/976,532 entitled "STORAGE ARRAY COMPRESSION BASED ON THE STRUCTURE OF THE DATA BEING COMPRESSED" filed on Dec. 21, 2015, Ser. No. 15/086,565, now U.S. Pat. No. 9,952,771, entitled "METHOD AND SYSTEM FOR CHOOSING AN OPTIMAL COMPRESSION ALGORITHM" filed on Mar. 31, 2016, and Ser. No. 15/267,620, now U.S. Pat. No. 10,116,329, entitled "METHOD AND SYSTEM FOR COMPRESSION BASED TIERING" filed on even date herewith the teachings of which applications are hereby incorporated herein by reference in their entirety.

TECHNICAL FIELD

This application relates to data storage and, more particularly, to data compression.

BACKGROUND

There are many types of storage disks. For example, there are flash disks, ATA (Advanced Technology Attachment or AT Attachment) disks and SATA (serial ATA) disks. When comparing the disks, the flash disks are more expensive but provide faster data retrieval (e.g., 1 million I/Os (input/output requests) per second) than ATA disks while the ATA disks are more expensive but provide faster data retrieval than the SATA disks (e.g., 100 per second). One way to be able to use less flash disks is to compress the data stored on a flash disk.

SUMMARY

Example embodiments of the present invention relate to methods, systems, and a computer program product for storing data compressed according to available system resources. The method includes evaluating system resources of a data storage system and selecting a compression algorithm according to the system resources. The data set then may be compressed according to the selected compression algorithm and the compressed data stored in the data storage system.

BRIEF DESCRIPTION OF THE DRAWINGS

Objects, features, and advantages of embodiments disclosed herein may be better understood by referring to the following description in conjunction with the accompanying drawings. The drawings are not meant to limit the scope of the claims included herewith. For clarity, not every element may be labeled in every Figure. The drawings are not necessarily to scale, emphasis instead being placed upon illustrating embodiments, principles, and concepts. Thus, features and advantages of the present disclosure will become more apparent from the following detailed description of exemplary embodiments thereof taken in conjunction with the accompanying drawings in which:

DETAILED DESCRIPTION

Figure 1:
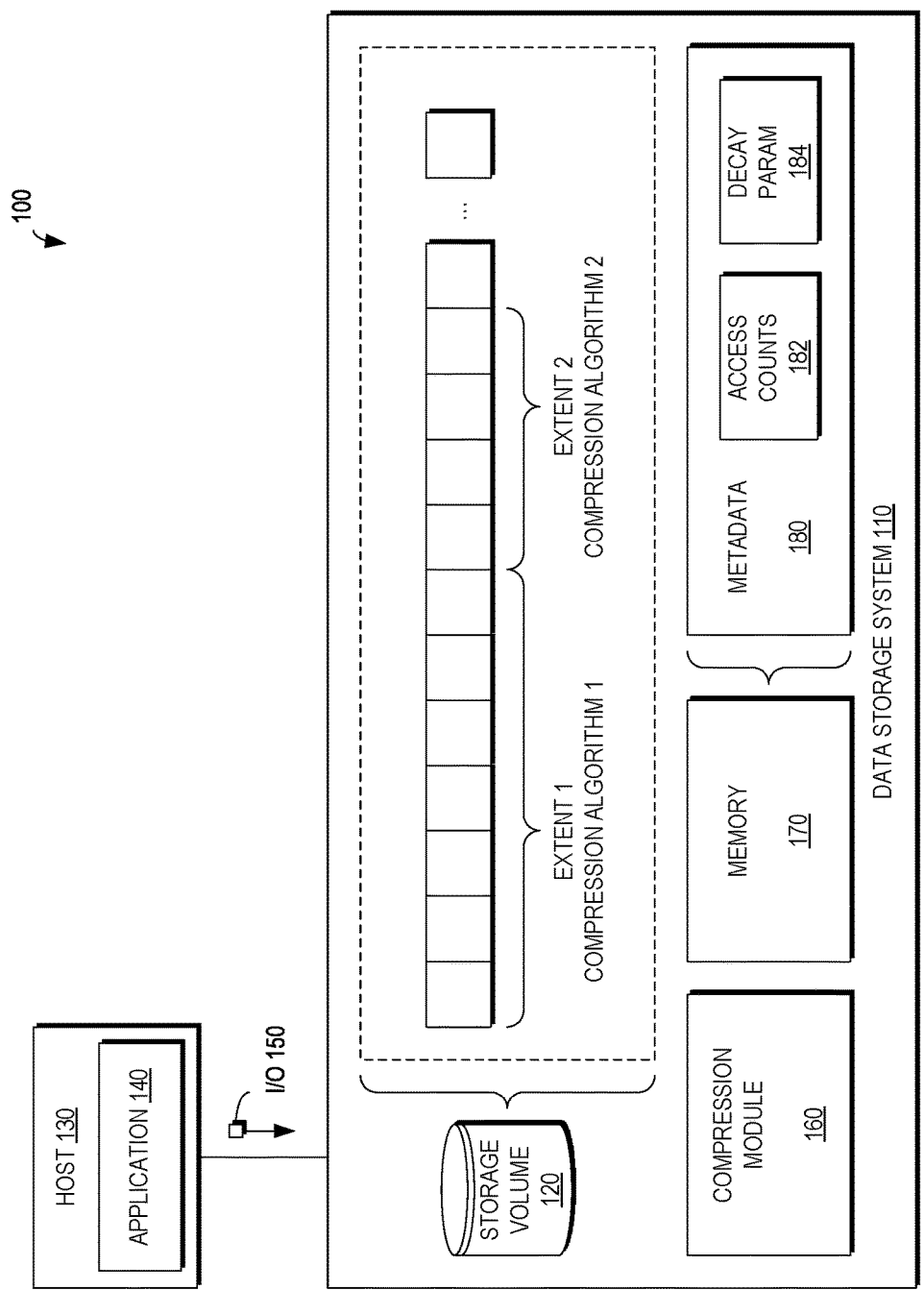
FIG. 1 is a block diagram of a data storage system for storing data compressed according to a level of activity of a data set according to an example embodiment of the present invention.

In traditional data storage systems there are many compression algorithms having various behaviors, advantages, and disadvantages. Typically, data storage systems employ only one particular compression algorithm which may lead to suboptimal results (e.g., compute time and compression ratio) if the compression algorithm is not well suited to the operational parameters of the data storage system. Accordingly, choosing a compression algorithm is a very important task as different compression algorithms may be better suited for different applications in the data storage system.

In certain data storage systems, storage tiering may be employed to monitor activity of data and, based on activity, determine data activity for assignment of that data to varying performant tiers of storage. For example, VNX® storage systems by EMC Corporation of Hopkinton, Mass., employ FAST® tiering to move data across tiers based on, for example, activity counters (e.g., storing a counter about the amount of accesses each extent has). An exemplary data storage system may have 5-20% flash drives and 80-95% SAS drives and keep the most active data on flash.

Such data storage systems also may offer compression algorithms in order to, for example, preserve expensive space on the array for high-activity data and relegate "cold" data to cheaper, less performant storage. Further, there are many different compression algorithms, each offering different unique features and having advantages and disadvantages over others. It should be understood that, with the appearance of all-flash arrays, such as XtremIO® all flash arrays by EMC Corporation of Hopkinton, Mass., introducing faster, yet more expensive drives, this trend is on the rise.

In certain example embodiments, the data storage system may be a flash storage array. In other example embodiments, the data storage system may be a scalable data storage system using content addressing. In one example, the data storage system may include one or more of the features of a device for scalable data storage and retrieval using content addressing described in U.S. Pat. No. 9,104,326 entitled "SCALABLE BLOCK DATA STORAGE USING CON- TENT ADDRESSING" commonly assigned with the present application to EMC Corporation of Hopkinton, Mass., the teachings of which are incorporated herein in their entirety.

In certain embodiments, the data storage system may store data in a compressed manner with a compression algorithm determined based according to the structure of the data being compressed, as described in U.S. patent application Ser. No. 14/976,532 entitled "STORAGE ARRAY COMPRESSION BASED ON THE STRUCTURE OF THE DATA BEING COMPRESSED" filed on Dec. 21, 2015, incorporated herein by reference in its entirety.

Further, as described above, different compression algorithms may perform better on different types of data, and certain embodiments of the data storage system may support multiple different compression algorithms on a single array in order to provide optimal compression (e.g., for a specific array or data set stored on the array), as described in U.S. patent application Ser. No. 15/086,565, now U.S. Pat. No. 9,952,771, entitled "METHOD AND SYSTEM FOR CHOOSING AN OPTIMAL COMPRESSION ALGORITHM" filed on Mar. 31, 2016, incorporated herein by reference in its entirety.

It should be understood that compression tradeoffs may be necessary. For example, a comparison of various compression algorithms showing differences in compression time and compression ratios may be found at http://binfalse.de/2011/04/04/comparison-of-compression/, incorporated by reference in its entirety. For example, a basic compression algorithm may allow roughly 10% of the most active data to be compressed in a more relaxed method (i.e., with a lower compression ratio taking less time for compression) while the rest of the data is compressed in a more extreme approach (i.e., with a higher compression ratio taking more time for compression).

FIG. 1 is a block diagram illustrating a system 100 for storing data using a compression algorithm selected with respect to an activity level of the data according an example embodiment of the present invention. FIGS. 2A-2D are flow diagrams illustrating methods for storing data using a compression algorithm selected with respect to an activity level of the data according an example embodiment of the present invention. FIGS. 1 and 2A-2D may be described in conjunction.

As illustrated in FIG. 1, a data storage system 110 may include a storage volume 120, a compression module 160, and memory 170 storing, for example, metadata 180. The metadata 180 may include access counts 182 used, for example, to determine data storage tiering within the data storage system 110 and decay parameters 184 as will be described in greater detail below. The data storage system 110 may store data in a plurality of extents as understood in the art. In certain embodiments, the compression module 160 may compress data to be stored in the storage volume 120 according to a compression algorithm selected from a plurality of compression algorithms.

Figure 2:
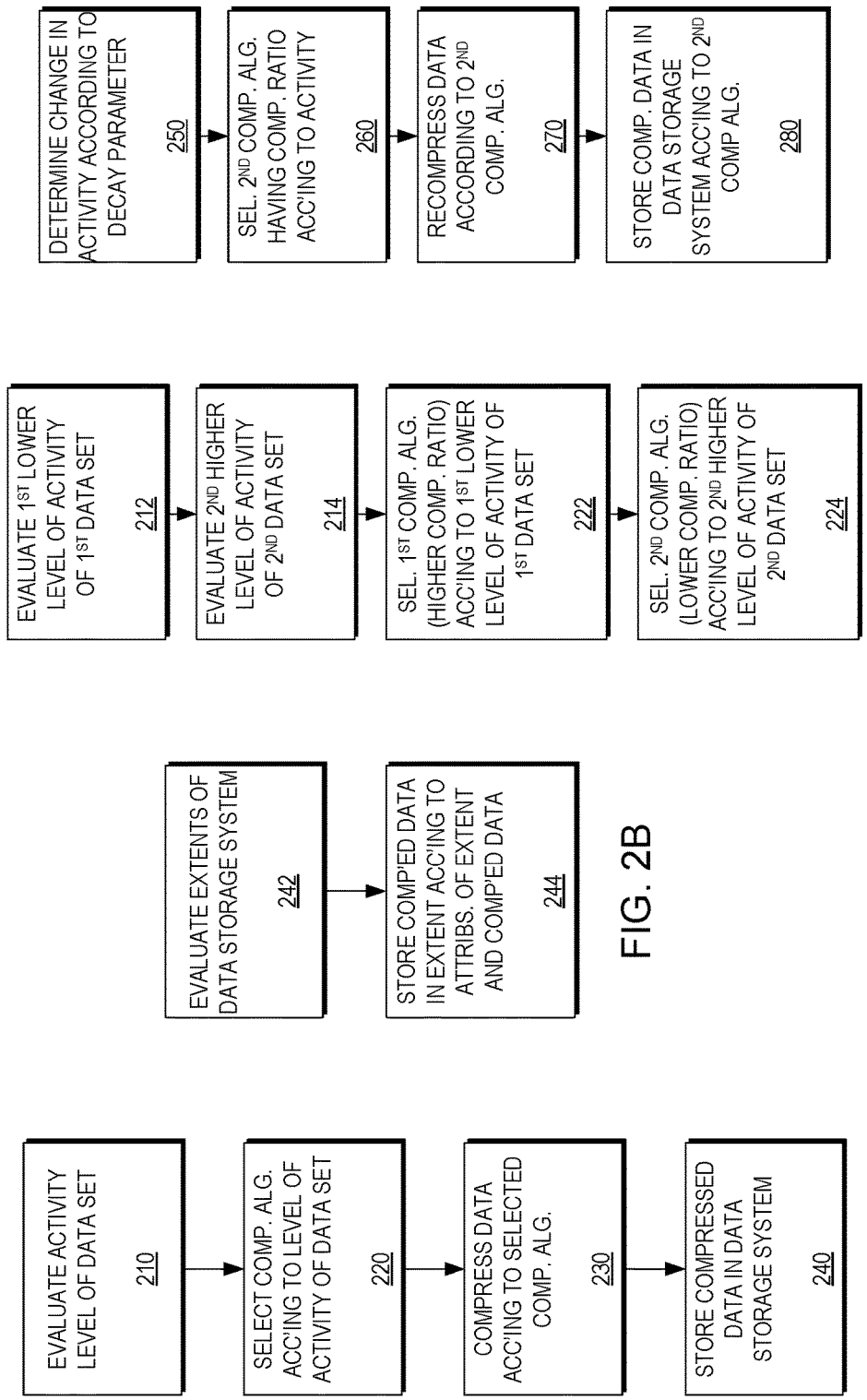
FIGS. 2A-2D are flow diagrams illustrating methods for storing data compressed according to a level of activity of a data set according to example embodiments of the present invention.

As illustrated in FIG. 2A, example embodiments of the present invention may evaluate a level of activity of a data set (210) and select a compression algorithm according to the level of activity of the data set (220). The data of the data set then may be compressed according to the selected compression algorithm (230) and the compressed data then may be stored in the data storage system 110 (240). It should be understood that compression algorithm selection for a data set may be on a physical level (e.g., per drive or array) or on a logical level (e.g., per logical devices/storage groups, or a mapping to a single application).

As illustrated in FIG. 2B, example embodiments of the present invention may evaluate extents of the data storage system 110 (242) and store the compressed data in an extent of the data storage system 110 according to attributes of the extent and the compressed data (244). It should be understood that, in a preferred embodiment, an extent may be a fixed sized sequential data set that may be stored at a data storage location determined by the data storage system and may use the compression algorithm selected above.

As illustrated in FIG. 2C, example embodiments of the present invention may evaluate a first lower level of activity for a first data set (212) and evaluate a second higher level of activity for a second data set (214). Example embodiments then may select a first compression algorithm having a first higher compression ratio according to the first lower level of activity of the first data set (222) and select a second compression algorithm having a second lower compression ratio according to the second higher level of activity of the second data set (224). For example, data having a first higher activity level may be compressed according to a first compression algorithm having a lower compression ratio and stored to a first more performant tier of storage in the data storage system 110. Likewise, data having a second lower activity level may be compressed according to a second compression algorithm having a second higher compression ratio to a second lesser performant tier of storage in the data storage system 110. It should be understood that, in certain embodiments, the tier size may vary and new tiers may emerge as the tiers are a logical concept relying the compression type. In certain embodiments, these extents may comprise of one or more blocks depending on their initial size and the compression algorithm.

As illustrated in FIG. 2D, in other example embodiments of the present invention, the data storage system 110 may recompress data using a compression algorithm selected with respect to an activity level of the data. Each extent may have an in memory decay parameter. In operation of the data storage system 110, as each I/O operation 150 is received from an application 140 operating on a host 130 and performed on an extent, the decay parameter for the extent may be increased. For example, a decay parameter may be obtained from the data storage system tiering mechanism (e.g., FAST) and the data storage system 110 may periodically (e.g., 10 minutes) determine the relative activity levels for the data and adjust the selected compression algorithms accordingly.

For example, the data storage system may determine a change in activity from a first level of activity to a second level of activity at a second time of operation of the data storage system according to the decay parameter (250). The data storage system 110 then may select a second compression algorithm having a second compression ratio selected according to the second level of activity at the second time of operation of the data storage system (260). The data storage system 110 then may recompress the data of the data set according to the selected second compression algorithm (270) and store the compressed data in the data storage system 110 according to the second compression algorithm (280).

In other words, for data that is not highly active but is compressed using a light compression algorithm with a low compression ratio, the data storage system 110 may determine to recompress the data in a more space-efficient, but less performant compression algorithm in order to reduce the data storage system storage resources to maintain the data. Likewise, for data that is highly active but is compressed using a heavy compression algorithm with a high compression ratio, the data storage system 110 may determine to recompress the data in a more performant, but less space-efficient compression algorithm in order to reduce the data storage system processing resources necessary to decompress the data with each access (potentially to no compression). It should be understood that, although the above example illustrates only two compression tiers, the data storage system may employ three or more compression algorithms for multiple compression tiers.

Figure 3:
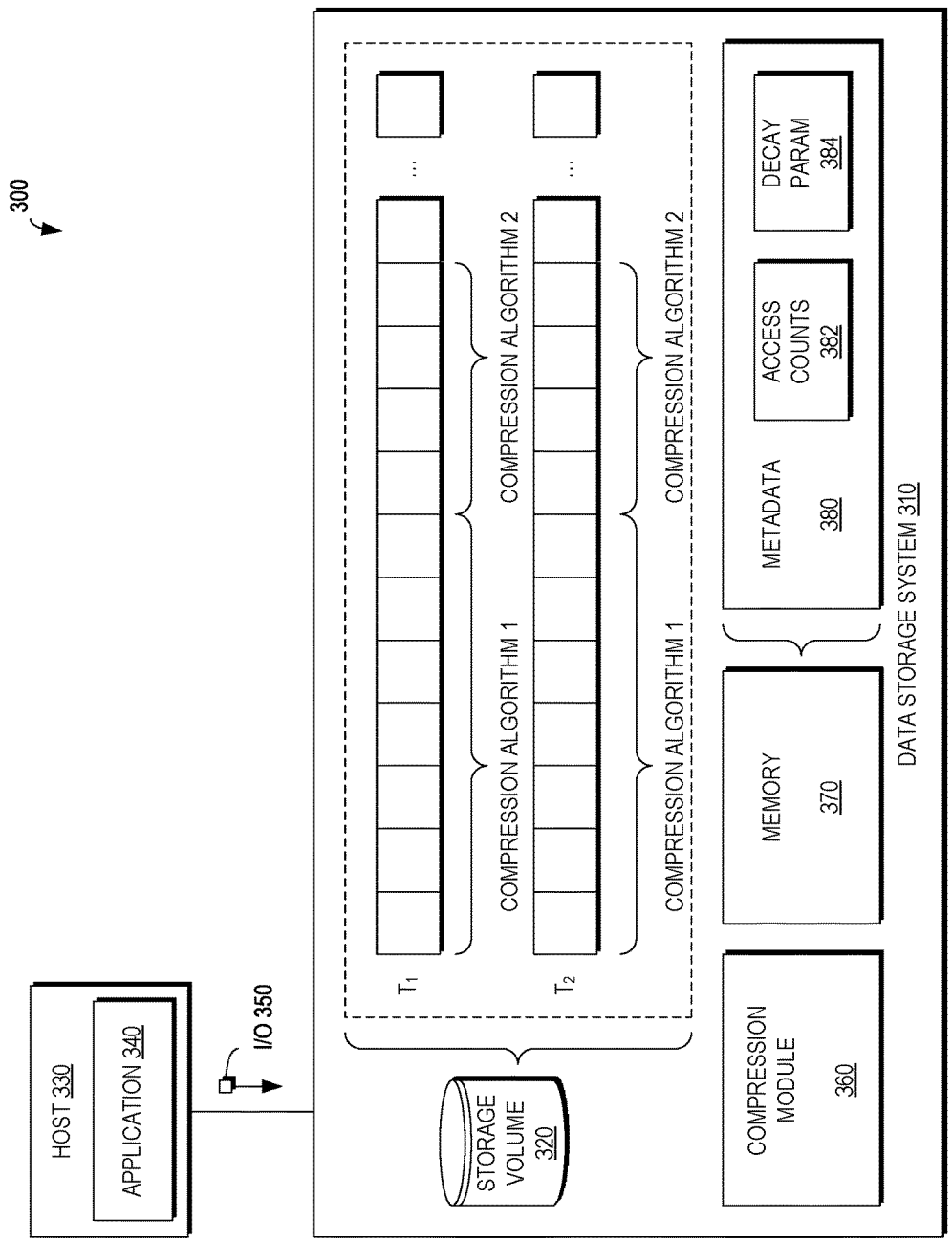
FIG. 3 is a block diagram of a data storage system for storing data compressed according to available system resources according to an example embodiment of the present invention.

FIG. 3 is a block diagram illustrating a system 300 for storing data using a compression algorithm selected with respect to data storage system resources according an example embodiment of the present invention. FIGS. 4A-4E are flow diagrams illustrating methods for storing data using a compression algorithm selected with respect to data storage system resources according an example embodiment of the present invention. FIGS. 3 and 4A-4E may be described in conjunction.

Figure 4C:
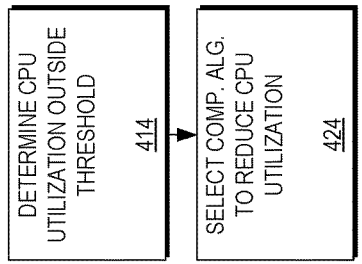
FIGS. 4A-4E are flow diagrams illustrating methods for storing data compressed according to available system resources according to example embodiments of the present invention.
Figure 4E:
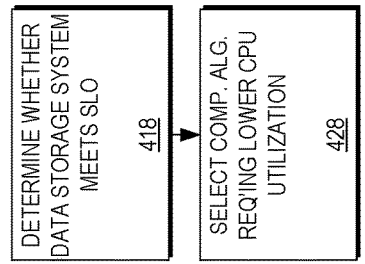

As illustrated in FIG. 3, a data storage system 310 may include a storage volume 320, a compression module 360, and memory 370 storing, for example, metadata 380. The metadata 380 may include access counts 382 used, for example, to determine data storage tiering within the data storage system 310 and decay parameters 384. In operation of the data storage system 310, I/O operations such as I/O operation 350 are received from an application 340 operating on a host 330. The data storage system 310 may choose a compression algorithm according to data storage system resources. At a first time $T_1$, a first extent is compressed according to compression algorithm 1 and a second extent is compressed according to compression algorithm 2 as determined by system resources of the data storage system 310 at time $T_1$. However, as illustrated in FIGS. 3 and 4A, at a second time $T_2$, the data storage system 310 evaluates system resources (410) and selects a compression algorithm according to the available system resources (420). The data storage system then may compress (or, in this case, recompress) the data (here, the second extent) according to the selected compression algorithm (e.g., compression algorithm 1) (430) as determined by the system resource of the data storage system 310 at time $T_2$. The data storage system 310 then may store the compressed data (440).

As will be described in greater detail below with respect to FIGS. 4B-4E, the data storage system 310 may examine various parameters in order to determine an optimal compression algorithm at a given time. For example, if the data set is used frequently, the data storage system may not compress the data at all or may use a light compression algorithm to prevent excessive use of system resources to perform decompression on the data set for its use. It should be understood that such a determination may be made according to compression ratio/compression time (i.e., amount of CPU time to compress the data) pairs and the data storage system 310 may employ one or more of the following criteria (as illustrated in FIGS. 4B-4E), among others, in selection a compression algorithm.

Figure 4B:
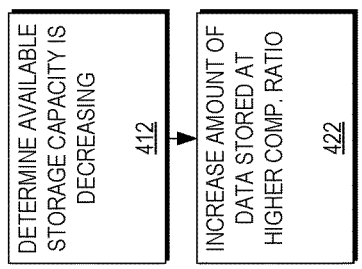

As illustrated in FIG. 4B, some example embodiments may choose a compression algorithm according to an amount of storage space (i.e., remaining capacity) available (or expected to be available resulting from data growth) on the data storage system 310 (i.e., if free capacity is decreasing (412), the data storage system may increase the percentage of data being compressed using a heavier compression algorithm (422), thus extending the available capacity in the system).

As illustrated in FIG. 4C, still other example embodiments may choose a compression algorithm according to CPU utilization of the data storage system 310. For example, the data storage system 310 may evaluate CPU usage at a peak time (414) and, if it is high, select a more lightweight compression algorithm to reduce CPU utilization (424) at the expense of storage space.

Figure 4D:
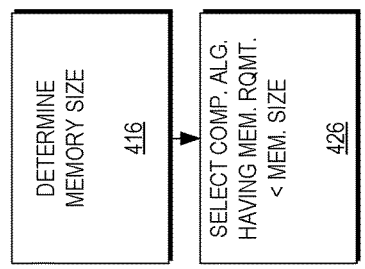
Figure 4A:
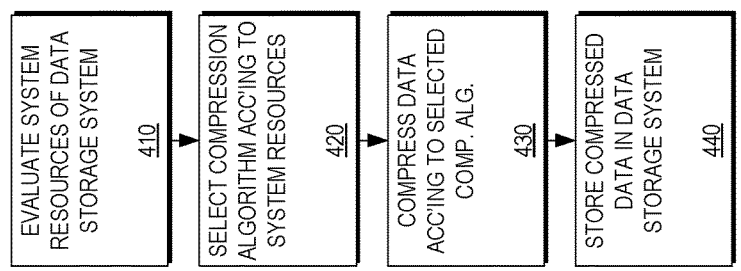

As illustrated in FIG. 4D, other embodiments may take into consideration the size of the data storage system memory 370 (416), how much free space is left, and the amount of memory necessary to perform the compression, and select a compression algorithm having a memory requirement less than that of the available memory size (426).

As illustrated in FIG. 4E, further example embodiments may choose a compression algorithm according to a required service level objective (SLO) for an application for the data storage system (e.g., for the data used by a specific application). For example, if the data storage system is not meeting the service level for an application (418), the data storage system may transition to a more lightweight compression algorithm requiring lower CPU utilization (428) to increase data storage system performance.

Figure 5:
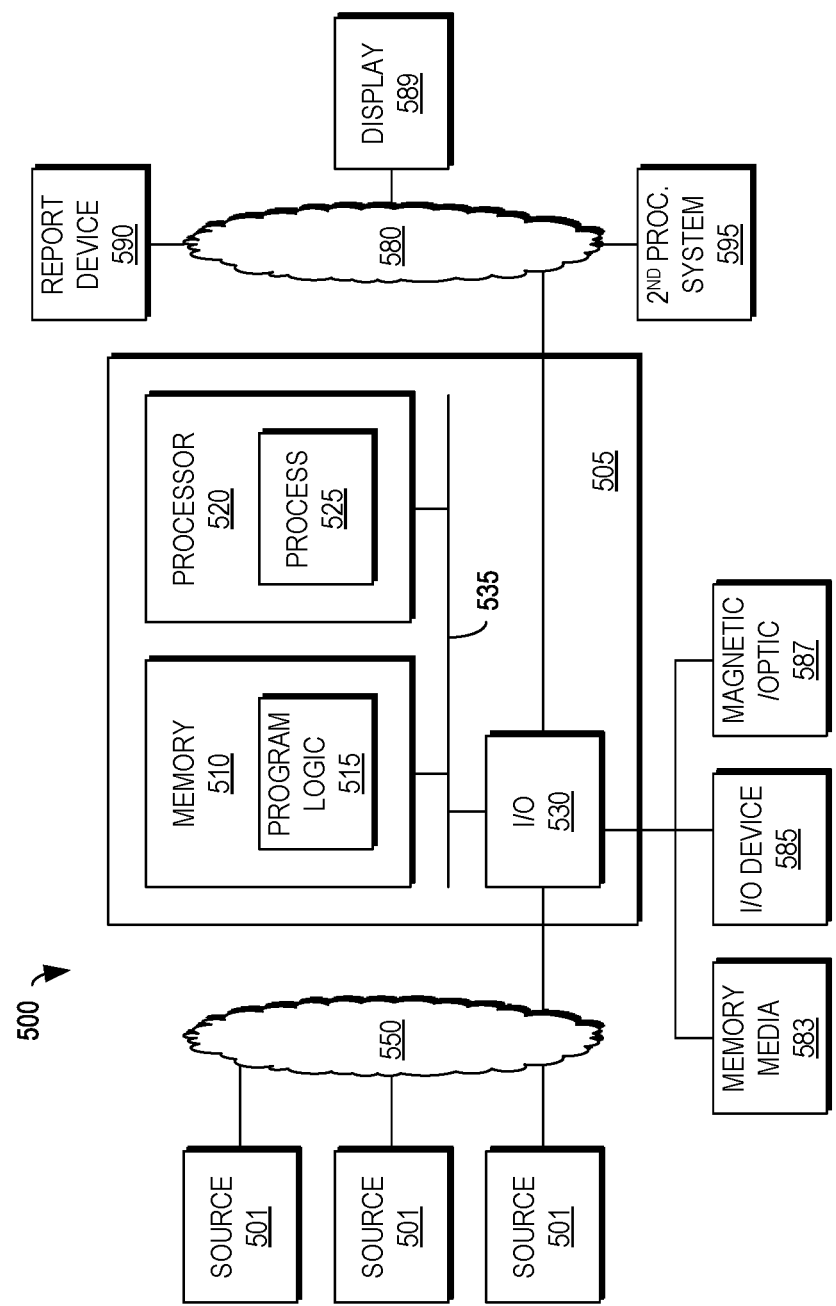
FIG. 5 is a block diagram illustrating an apparatus according to an example embodiment of the present invention.

It should be understood that the change of compression algorithm need not apply to all data; rather, the data storage system may recommend increasing or decreasing an amount of data stored using a particular compression algorithm. Eventually, the data storage system may recommend a compression-based tiering policy for each data set to guarantee optimal resource utilization and meeting service level requirements FIG. 5 is a block diagram of an example embodiment apparatus 505 according to the present invention. The apparatus 505 may be part of a system 500 and includes memory 510 storing program logic 515, a processor 520 for executing a process 525, and a communications I/O interface 530, connected via a bus 535. The I/O interface 530 provides connectivity to memory media 583, I/O device 585, and drives 587, such as magnetic or optical drives. The apparatus 505 is configured to communicate with a plurality of sources 501 via a network 550 using the I/O interface 530. The apparatus 505 is further configured to communicate with a display 589, a report device 590, and a second processing system 595 via a network 580 using the I/O interface 530. The exemplary apparatus 505 is discussed only for illustrative purpose and should not be construed as a limitation on the embodiments or scope of the present disclosure. In some cases, some devices may be added to or removed from a computer system based on specific situations. For example, a computer system may be representative of a standalone system or a system of a production site, which comprises a number of hosts coupled to a source disk and a target disk. In most embodiments, a system/device may comprise a processor and a memory, such as a laptop computer, personal digital assistant, or mobile phones.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

In some embodiments, the system may be performed by one or more programmable processors executing one or more computer programs to perform the functions of the system. In some other embodiments, all or part of the system may be implemented as special purpose logic circuitry (e.g., a field-programmable gate array (FPGA) and/or an application-specific integrated circuit (ASIC)). In some other embodiments, all or part of the system may be implemented using electronic hardware circuitry that include electronic devices such as, for example, at least one of a processor, a memory, a programmable logic device or a logic gate.

In one embodiment, the methods described herein are not limited to the specific examples described. In a further embodiment, rather, any of the method steps may be re-ordered, combined or removed, or performed in parallel or in serial, as necessary, to achieve the results set forth above.

In some embodiments, the system may be implemented, at least in part, via a computer program product, (e.g., in a non-transitory machine-readable storage medium such as, for example, a non-transitory computer-readable medium), for execution by, or to control the operation of, data processing apparatus (e.g., a programmable processor, a computer, or multiple computers). In certain embodiments, each such program may be implemented in a high level procedural or object-oriented programming language to communicate with a computer system. In certain other embodiments, however, the programs may be implemented in assembly or machine language. In some embodiments, the language may be a compiled or an interpreted language and it may be deployed in any form, including as a stand-alone program or as a module, component, subroutine, or other unit suitable for use in a computing environment. In some other embodiments, a computer program may be deployed to be executed on one computer or on multiple computers at one site or distributed across multiple sites and interconnected by a communication network.

The methods and apparatus of this invention may take the form, at least partially, of program code (i.e., instructions) embodied in tangible non-transitory media, such as floppy diskettes, CD-ROMs, hard drives, random access or read only-memory, or any other machine-readable storage medium. When the program code is loaded into and executed by a machine, such as the computer of FIG. 5, the machine becomes an apparatus for practicing the invention. When implemented on one or more general-purpose processors, the program code combines with such a processor to provide a unique apparatus that operates analogously to specific logic circuits. As such, a general purpose digital machine can be transformed into a special purpose digital machine. In some other embodiment, a non-transitory machine-readable medium may include but is not limited to a hard drive, compact disc, flash memory, non-volatile memory, volatile memory, magnetic diskette and so forth but does not include a transitory signal per se.

Figure 6:
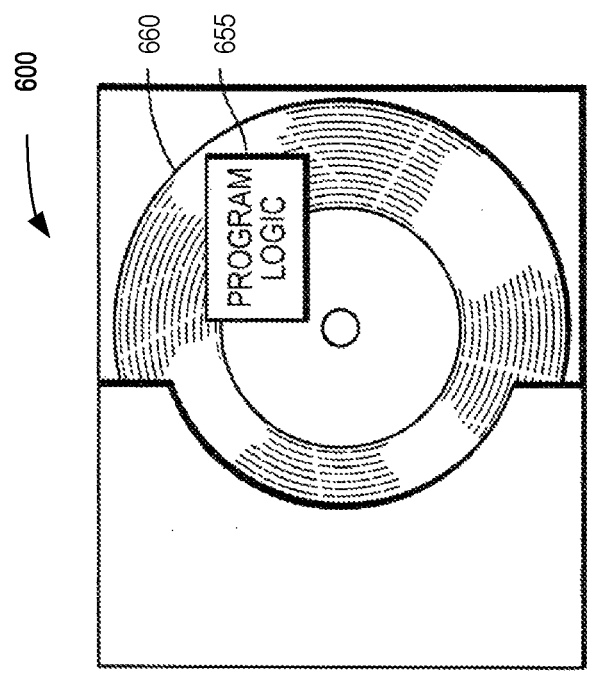
FIG. 6 is an illustrating of an example embodiment of the present invention as embodied in computer program code.

FIG. 6 is a block diagram of a computer program product 600 including program logic 655, encoded on a computer-readable medium 660 in computer-executable code configured for carrying out the methods of the invention, according to an example embodiment of the present invention. The logic for carrying out the method may be embodied as part of the aforementioned system, which is useful for carrying out a method described with reference to embodiments shown. In one embodiment, program logic 655 may be loaded into memory and executed by a processor. In a further embodiment, program logic 655 may also be the same program logic 655 on a computer readable medium.

Various exemplary embodiments of the present disclosure have been described with reference to the accompanying drawings. It should be noted that all of these drawings and description are only presented as exemplary embodiments. It should also be noted that based on the subsequent description, alternative embodiments may be conceived that may have a structure and method disclosed as herein, and such alternative embodiments may be used without departing from the principle of the disclosure as claimed in the present disclosure.

It may be appreciated that these exemplary embodiments are provided only for enabling those skilled in the art to better understand and then further implement the present disclosure, not intended to limit the scope of the present disclosure in any manner. Besides, in the drawings, for a purpose of illustration, optional steps, modules, and units are illustrated in dotted-line blocks.

The terms "comprise(s)," "include(s)", their derivatives and like expressions used herein should be understood to be open, i.e., "comprising/including, but not limited to". The term "based on" means "at least in part based on". The term "one embodiment" means "at least one embodiment"; and the term "another embodiment" indicates "at least one further embodiment". Reference to a "computer" may be a physical computer or a virtual computer (i.e., virtual machine). Relevant definitions of other terms have been provided in this description.

It may be noted that the flowcharts and block diagrams in the figures may illustrate the apparatus, method, as well as architecture, functions and operations executable by a computer program product according to various embodiments of the present disclosure. In this regard, each block in the flowcharts or block diagrams may represent a module, a program segment, or a part of code, which may contain one or more executable instructions for performing specified logic functions. It should be further noted that in some alternative implementations, functions indicated in blocks may occur in an order differing from the order as illustrated in the figures. For example, two blocks shown consecutively may be performed in parallel substantially or in an inverse order sometimes, which depends on the functions involved. It should be further noted that each block and a combination of blocks in the block diagrams or flowcharts may be implemented by a dedicated, hardware-based system for performing specified functions or operations or by a combination of dedicated hardware and computer instructions.

Although the foregoing invention has been described in some detail for purposes of clarity of understanding, it will be apparent that certain changes and modifications may be practiced within the scope of the appended claims. The scope of the invention is limited only by the claims and the invention encompasses numerous alternatives, modifications, and equivalents. Numerous specific details are set forth in the above description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured. Accordingly, the above implementations are to be considered as illustrative and not restrictive, and the invention is not to be limited to the details given herein, but may be modified within the scope and equivalents of the appended claims.

What is claimed is:

1. A method comprising:
evaluating system resources of a data storage system;
selecting a first compression algorithm, from a plurality of compression algorithms, according to the system resources and a first activity level of the data storage system, wherein the first compression algorithm has a first compression ratio;

compressing data of a data set according to the first compression algorithm;

storing the compressed data in the data storage system;

determining a second activity level of the data storage system based upon an in memory decay parameter for the data of the data set;

selecting a second algorithm, from the plurality of compression algorithms, according to the second activity level of the data storage system, wherein the second algorithm has a second compression ratio;

recompressing the compressed data of the data set according to the second compression algorithm; and storing the recompressed data;

wherein the in memory decay parameter is stored as metadata in a memory of the data storage system separate from a storage volume comprising one or more extents used to store the data of the data set; and wherein a first value of the decay parameter is indicative of the first activity level and a second value of the decay parameter different than the first value of the decay parameter is indicative of the second activity level.

2. The method of claim 1 wherein the system resources of the data storage system comprise two or more of available storage capacity, CPU utilization, and memory usage.

3. The method of claim 1
wherein evaluating system resources of a data storage system comprises determining available storage capacity is decreasing; and
wherein selecting the first compression algorithm according to the system resources and the first activity level comprises increasing an amount of data stored in the data storage system according to a third compression algorithm having a higher compression ratio than a fourth compression algorithm having a lower compression ratio.

4. The method of claim 1
wherein evaluating system resource of a data storage system comprises determining a CPU utilization is outside a threshold; and
wherein selecting the first compression algorithm according to the system resources and the first activity level comprises, for a CPU utilization above a first threshold, selecting the first compression algorithm requiring a first amount of CPU utilization and, for a CPU utilization below a second threshold, selecting a third compression algorithm requiring a second amount of CPU utilization higher than the first amount of CPU utilization.

5. The method of claim 1
wherein evaluating system resource of a data storage system comprises determining a memory size; and
wherein selecting the first compression algorithm according to the system resources comprises selecting a compression algorithm having a memory requirement less than the memory size.

6. The method of claim 1 wherein selecting a first compression algorithm according to the system resources comprises selecting the first compression algorithm according to the system resources in view of a required service level objective provided by the data storage system.

7. The method of claim 6 further comprising, if the required service level objective is not being met by the data storage system having the first compression algorithm requiring a first amount of CPU utilization, selecting a third compression algorithm requiring a second amount of CPU utilization lower than the first amount of CPU utilization.

8. The method of claim 1 further comprising periodically reevaluating the system resources of the data storage system.

9. The method of claim 8 wherein selecting the first compression algorithm according to the system resources comprises determining, for the data set having a third compression algorithm having a third compression ratio selected according to a first set of evaluated system resources at a first time of operation of the data storage system, a change in system resources from the first set of evaluated system resources to a second set of evaluated system resources at a second time of operation of the data storage system.

10. A system comprising:
one or more processors; and
memory storing computer program code that when executed on the one or more processors causes the system to perform the operations of:
evaluating system resources of a data storage system;
selecting a first compression algorithm, from a plurality of compression algorithms, according to the system resources and a first activity level of the data storage system, wherein the first compression algorithm has a first compression ratio;
compressing data of a data set according to the first compression algorithm;
storing the compressed data in the data storage system;
determining a second activity level of the data storage system based upon an in memory decay parameter for the data of the data set;
selecting a second algorithm, from the plurality of compression algorithms, according to the second activity level of the data storage system, wherein the second algorithm has a second compression ratio;
recompressing the compressed data of the data set according to the second compression algorithm; and
storing the recompressed data;
wherein the in memory decay parameter is stored as metadata in a memory of the data storage system separate from a storage volume comprising one or more extents used to store the data of the data set; and
wherein a first value of the decay parameter is indicative of the first activity level and a second value of the decay parameter different than the first value of the decay parameter is indicative of the second activity level.

11. The system of claim 10 wherein the system resources of the data storage system comprise two or more of available storage capacity, CPU utilization, and memory usage.

12. The system of claim 10
wherein evaluating system resources of a data storage system comprises determining available storage capacity is decreasing; and
wherein selecting the first compression algorithm according to the system resources and the first activity level comprises increasing an amount of data stored in the data storage system according to a first compression algorithm having a higher compression ration than a third compression algorithm having a lower compression ratio.

13. The system of claim 10
wherein evaluating system resource of a data storage system comprises determining a CPU utilization is outside a threshold; and
wherein selecting the first compression algorithm according to the system resources and the first activity level comprises, for a CPU utilization above a first threshold, selecting a first compression algorithm requiring a first amount of CPU utilization and, for a CPU utilization below a second threshold, selecting a third compression algorithm requiring a second amount of CPU utilization higher than the first amount of CPU utilization.

14. The system of claim 10
wherein evaluating system resource of a data storage system comprises determining a memory size; and
wherein selecting the first compression algorithm according to the system resources comprises selecting a compression algorithm having a memory requirement less than the memory size.

15. The system of claim 10 wherein selecting the first compression algorithm according to the system resources comprises selecting the first compression algorithm according to the system resources in view of a required service level objective provided by the data storage system.

16. The system of claim 15 further comprising, if the required service level objective is not being met by the data storage system having a first compression algorithm requiring a first amount of CPU utilization, selecting a second compression algorithm requiring a second amount of CPU utilization lower than the first amount of CPU utilization.

17. The system of claim 10 further comprising periodically reevaluating the system resources of the data storage system.

18. The system of claim 17 wherein selecting a first compression algorithm according to the system resources comprises determining, for the data set having a third compression algorithm having a first compression ratio selected according to a first set of evaluated system resources at a third time of operation of the data storage system, a change in system resources from the first set of evaluated system resources to a second set of evaluated system resources at a second time of operation of the data storage system.

19. A computer program product including a non-transitory computer readable storage medium having computer program code encoded thereon that when executed on a processor of a computer causes the computer to store data, the computer program code comprising:
  computer program code for evaluating system resources of a data storage system;
  computer program code for selecting first compression algorithm, from a plurality of compression algorithms, according to the system resources and a first activity level of the data storage system, wherein the first compression algorithm has a first compression ratio;
  computer program code for compressing data of a data set according to the first compression algorithm;
  computer program code for storing the compressed data in the data storage system
  computer program code for determining a second activity level of the data storage system based upon an in memory decay parameter for the data of the data set;
  computer program code for selecting a second algorithm, from the plurality of compression algorithms, according to the second activity level of the data storage system, wherein the second algorithm has a second compression ratio;
  computer program code for recompressing the compressed data of the data set according to the second compression algorithm; and
  computer program code for storing the recompressed data;
  wherein the in memory decay parameter is stored as metadata in a memory of the data storage system separate from a storage volume comprising one or more extents used to store the data of the data set; and
  wherein a first value of the decay parameter is indicative of the first activity level and a second value of the decay parameter different than the first value of the decay parameter is indicative of the second activity level.

20. The computer program product of claim 19 wherein the system resources of the data storage system comprise two or more of available storage capacity, CPU utilization, and memory usage.

* * * * *